United States Patent
Chan et al.

(10) Patent No.: US 9,166,152 B2
(45) Date of Patent: Oct. 20, 2015

(54) DIFFUSIONLESS TRANSFORMATIONS IN MTJ STACKS

(71) Applicant: Samsung Electronics Co., LTD., Gyeonggi-do (KR)

(72) Inventors: Keith Chan, San Jose, CA (US); Alexey Vasilyevitch Khvalkovskiy, Milpitas, CA (US); Dmytro Apalkov, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 203 days.

(21) Appl. No.: 13/839,672

(22) Filed: Mar. 15, 2013

(65) Prior Publication Data

US 2014/0175578 A1      Jun. 26, 2014

Related U.S. Application Data

(60) Provisional application No. 61/745,587, filed on Dec. 22, 2012.

(51) Int. Cl.
*H01L 43/08* (2006.01)
*H01L 43/12* (2006.01)
*H01L 27/22* (2006.01)

(52) U.S. Cl.
CPC ............... *H01L 43/12* (2013.01); *H01L 43/08* (2013.01); *H01L 27/228* (2013.01)

(58) Field of Classification Search
CPC ......... H01L 43/02; H01L 29/82; H01L 27/22; H01L 43/08; H01L 43/10; H01L 43/12; G11C 11/14–11/16; G11C 11/161

USPC ................... 365/158; 257/421, 295
See application file for complete search history.

(56) References Cited

U.S. PATENT DOCUMENTS

| | | | |
|---|---|---|---|
| 6,495,873 B2 | 12/2002 | Schwarzl | |
| 7,566,941 B2 * | 7/2009 | Ruehrig | 257/421 |
| 7,672,088 B2 * | 3/2010 | Zhang et al. | 360/324.11 |
| 7,800,866 B2 | 9/2010 | Ide | |
| 7,894,165 B2 | 2/2011 | Mizuno | |
| 7,943,974 B2 | 5/2011 | Ishikawa | |
| 7,957,106 B2 | 6/2011 | Carey | |
| 8,057,925 B2 | 11/2011 | Horng | |
| 8,189,304 B2 | 5/2012 | Okamura | |
| 8,223,533 B2 * | 7/2012 | Ozeki et al. | 365/158 |
| 8,411,498 B2 * | 4/2013 | Kim et al. | 365/171 |
| 8,670,267 B2 * | 3/2014 | Watson et al. | 365/158 |

(Continued)

FOREIGN PATENT DOCUMENTS

| | | | |
|---|---|---|---|
| KR | 1021100124493 | 11/2010 | |
| WO | WO 2010134378 A1 * | 11/2010 | H01L 27/22 |

OTHER PUBLICATIONS

Kainuma et al., "Metamagnetic shape memory effect in NiMn-based Heusler-type alloys", Journal of Materials Chemistry, 18, 2008, pp. 1837-1842.*

*Primary Examiner* — Allison P Bernstein
(74) *Attorney, Agent, or Firm* — Convergent Law Group LLP

(57) ABSTRACT

A method and system provide a magnetic junction usable in a magnetic device. The magnetic junction includes a plurality of magnetic layers including a nonmagnetic spacer layer. The magnetic junction also includes at least one diffusionless transformation layer. The magnetic junction is configured to be switchable between a plurality of stable magnetic states when a write current is passed through the magnetic junction.

33 Claims, 6 Drawing Sheets

(56) References Cited

U.S. PATENT DOCUMENTS

| | | | |
|---|---|---|---|
| 8,786,039 B2* | 7/2014 | Apalkov et al. | 257/421 |
| 2007/0297220 A1* | 12/2007 | Yoshikawa et al. | 365/158 |
| 2010/0103565 A1 | 4/2010 | Lou | |
| 2011/0102948 A1* | 5/2011 | Apalkov et al. | 360/324.2 |
| 2011/0149647 A1 | 6/2011 | Kim | |
| 2012/0075922 A1* | 3/2012 | Yamada et al. | 365/158 |
| 2012/0091548 A1 | 4/2012 | Sukegawa | |

\* cited by examiner

DIFFUSIONLESS TRANSFORMATIONS IN MTJ STACKS

CROSS-REFERENCE TO RELATED APPLICATIONS

This application claims the benefit of provisional Patent Application Ser. No. 61/745,587, filed Dec. 22, 2012, entitled DIFFUSIONLESS TRANSFORMATIONS IN MTJ STACKS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional reference layer 16, a conventional tunneling barrier layer 18, a conventional free layer 20, and a conventional capping layer 22. Also shown is top contact 24.

The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator. For a higher signal, the conventional tunneling barrier 18 is typically crystalline MgO.

The conventional reference layer 16 and the conventional free layer 20 are magnetic. The magnetization 17 of the conventional reference layer 16 is fixed, or pinned, in a particular direction, typically by an exchange-bias interaction with the magnetization of AFM layer 14. Further, other versions of the conventional MTJ 10 might include an additional reference layer (not shown) separated from the free layer 20 by an additional nonmagnetic barrier or conductive layer (not shown). The conventional free layer 20 has a changeable magnetic moment 21. Although depicted as a simple layer, the conventional free layer 20 may also include multiple layers. Typically, materials such as CoFeB are used in the conventional free layer 16 and/or reference layer 20.

To switch the magnetic moment 21 of the conventional free layer 20, a current is driven perpendicular to plane (in the z-direction). When a sufficient current is driven from the top contact 24 to the bottom contact 11, the magnetic moment 21 of the conventional free layer 20 may switch to be parallel to the magnetic moment 17 of the conventional reference layer 16. When a sufficient current is driven from the bottom contact 11 to the top contact 24, the magnetic moment 21 of the free layer may switch to be antiparallel to that of the reference layer 16. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined.

FIG. 2 is a high level flow chart depicting a conventional method 50 for fabricating the conventional magnetic junction 10. The layers 12, 14, 16, 18, 20 and 22 for the magnetic junction 10 are deposited, via step 52. Typically a full film deposition is used. The conventional magnetic junction 10 is defined, via step 54. For example, the conventional magnetic junction 10 may be covered by a mask and exposed portions of the layers 12, 14, 16, 18, 20 and 22 removed via ion milling.

As part of fabrication, the conventional magnetic junction 10 is also annealed, via step 56. The annealing may be used to ensure that the layers of the conventional MTJ 10 have the desired crystal structure. For example, the MgO in the conventional tunneling barrier layer 18 is typically amorphous as deposited. In addition, the reference layer 16 and/or free layer 20 typically include a CoFeB layer, with up to twenty percent of B. These layers 16 and/or 20 may also be amorphous as-deposited. In order for the layers 16, 18 and 20 in the conventional MTJ 10 to have the desired crystal structure and crystallographic orientation, the conventional MTJ 10 is annealed in step 56. The annealing of the conventional MTJ 10 is typically carried out at a temperature of approximately three hundred degrees Celsius.

Although the conventional MTJ 10 may function, there are drawbacks to incorporating the conventional MTJ 10 in a memory. For example, even with the annealing carried out in step 56, the conventional MgO tunneling barrier layer 18 may not have the desired crystal structure. For example, the conventional MgO tunneling barrier 18 may not have the desired texture. Similarly, the reference layer 16 and free layer 20 may not be fully crystallized as desired. As a result, the TMR for the conventional MTJ 10 may be reduced.

In addition, as discussed above, the free layer 20 and/or reference layer 16 may include CoFeB. The presence of B in the free layer 20 and/or reference layer 16 aids in crystallization of the conventional tunneling barrier 20. It is believed that the mobility of B in the CoFeB allows the freedom in the lattice of the layers 16, 18 and/or 20 for rearrangement of the amorphous layers into ordered crystal structures. However, the mobility of the B also allows the B to interdiffuse into the MgO tunneling barrier 20. The B may also diffuse to other layers in the stack of the conventional MTJ 10. The presence B in the conventional tunneling barrier 18 and other layers may be detrimental to properties of the conventional MTJ, such as the TMR. Thus, the signal from the conventional MTJ is, again, reduced.

Other characteristics of the conventional MTJ 10 may also be desired to be improved. For example, the critical current is the write current required to be driven through the conventional MTJ 10 to switch the magnetic state of the free layer 16. The critical current of the conventional MTJ 10 may be too high for use in a spin transfer torque magnetic random access memory (STT-MRAM). For example, for use in an STT-MRAM, the critical switching current density may be desired to be less than 1 $MA/cm^2$. Further, although the magnetic moments 17 and 21 of the conventional reference layer 16 and conventional free layer 20 are shown as in plane, these moments may be desired to be perpendicular to plane. Thus, the free layer 20 and/or reference layer 16 may be desired to have a high perpendicular magnetic anisotropy (PMA). A high PMA occurs when the perpendicular anisotropy energy exceeds the out-of-plane demagnetization energy. This results in a magnetic moment that has a component perpendicular to plane and may be fully perpendicular to plane. Although such conventional high PMA junctions do exist, the PMA may be reduced by various factors. For example, PMA may be reduced by Co inclusions into Fe in a CoFe free layer 20, by the presence of B in the conventional free layer 20, as well as other factors. Further, the thermal stability of the conventional free layer 20 may be difficult to maintain using conventional high PMA materials. As a result, performance of the conventional MTJ may suffer. Consequently, mechanisms for tailoring the PMA may also be desired.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device. The magnetic junction includes a plurality of magnetic layers including a nonmagnetic spacer layer. The magnetic junction also includes at least one diffusionless transformation layer. The magnetic junction is configured to be switchable between a plurality of stable magnetic states when a write current is passed through the magnetic junction.

DETAILED DESCRIPTION OF THE INVENTION

Figure 1:
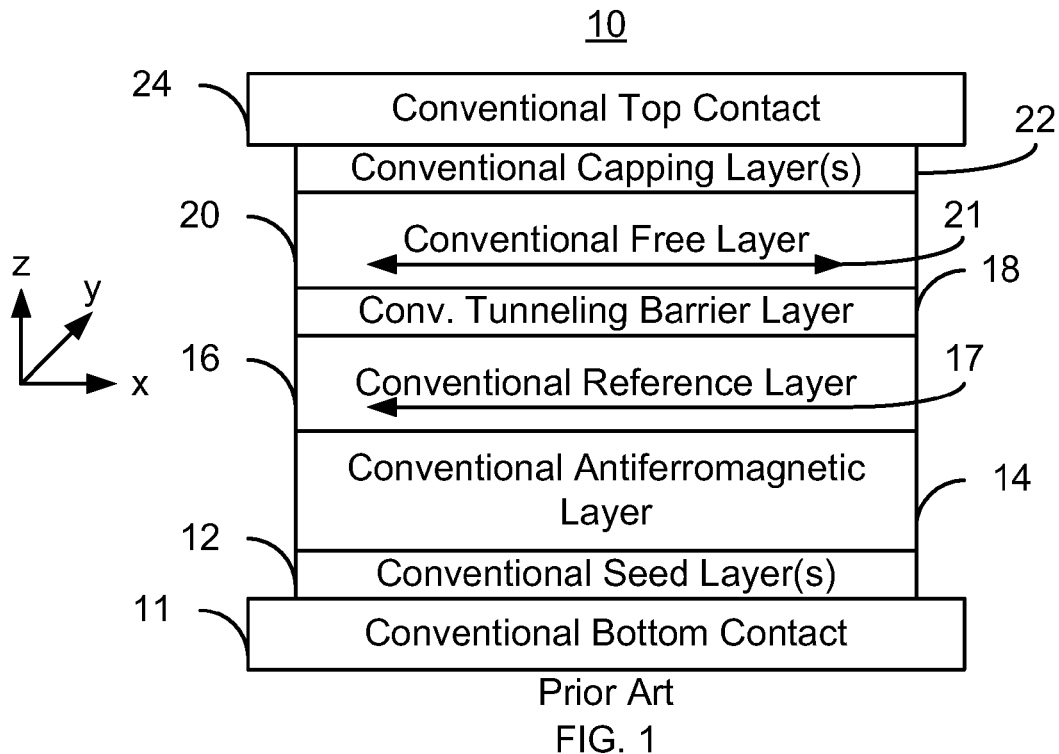
FIG. 1 depicts a conventional magnetic junction.
Figure 2:
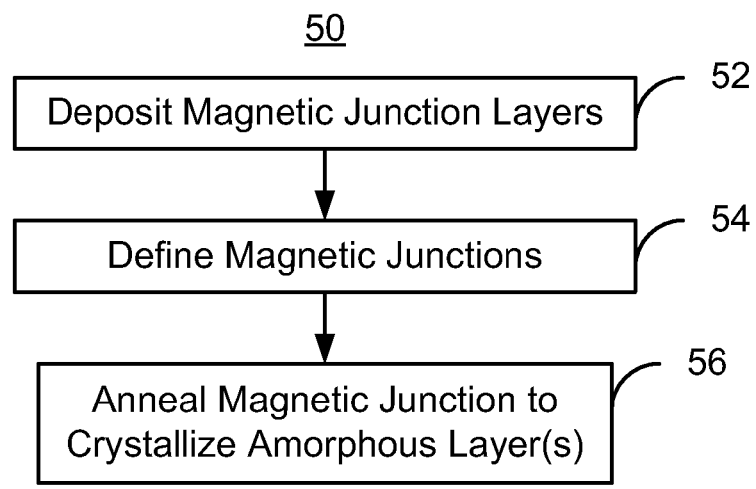
FIG. 2 depicts a conventional method for fabricating a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems provide a magnetic junction as well as a magnetic memory utilizing the magnetic junction. A method and system provide a magnetic junction usable in a magnetic device. The magnetic junction includes a plurality of magnetic layers including a nonmagnetic spacer layer. The magnetic junction also includes at least one diffusionless transformation layer. The magnetic junction is configured to be switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, diffusionless transformations, magnetic anisotropy (particularly perpendicular magnetic anisotropy), and other physical phenomena. Consequently, one of ordinary skill in the art will readily recognize that theoretical explanations of the behavior of the method and system are made based upon this current understanding of spin transfer, diffusionless transformations, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or free layers having particular layers, materials and characteristics. However, one of ordinary skill in the art will readily recognize that magnetic junctions and/or free layers having additional and/or different layers, materials and/or characteristics not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and free layers. However, one of ordinary skill in the art will readily recognize that the method and system are consistent with the use of magnetic memories having multiple magnetic junctions and using multiple free layers. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
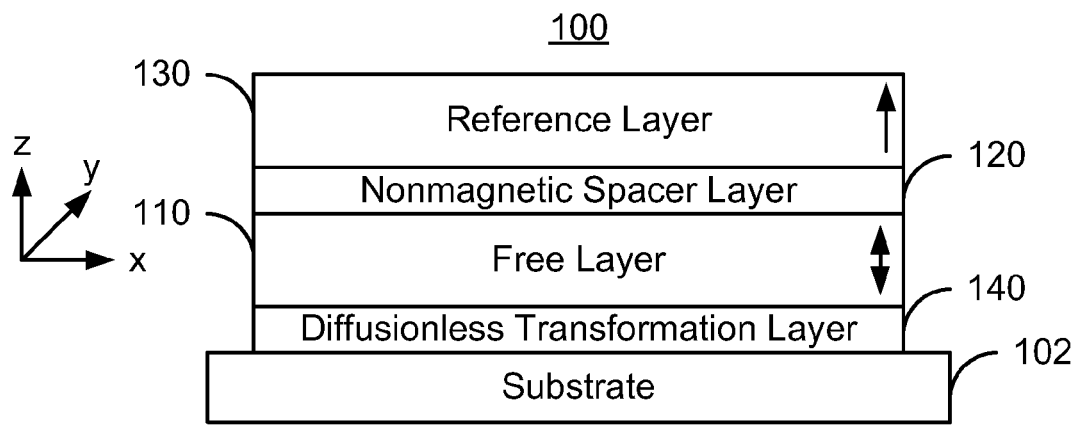
FIG. 3 depicts an exemplary embodiment of a magnetic junction including a diffusionless transformation layer and switchable using spin transfer.

FIG. 3 depicts an exemplary embodiment of a magnetic junction 100 including a diffusionless transformation layer and that is switchable using spin transfer. The magnetic junction may be, for example a magnetic tunneling junction (MTJ), spin valve, or ballistic magnetoresistance structure, or some combination thereof. The magnetic junction 100 may be used in a variety of applications. For example, the magnetic junction may be used in a magnetic memory such as an STT-MRAM. For clarity, FIG. 3 is not to scale.

The magnetic junction includes a free layer 110, a nonmagnetic spacer layer 120, a reference layer 130 and a diffusionless transformation layer 140. The magnetic junction 100 is shown as residing on a substrate 102. In some embodiments, the magnetic junction 100 may include seed layer(s) and/or capping layer(s) (not shown). Although layers 110, 120, and 130 are shown with a particular orientation, this orientation may vary in other embodiments. For example, the reference layer 130 may be closer to the bottom (closest to the substrate 102) of the magnetic junction 100. A pinning layer (not shown) may also be used. In general, the pinning layer would be used if the magnetic moment of the reference layer 130 (also known as a pinned layer) is in plane but would not be used if the magnetic moment of the reference layer 130 is perpendicular to plane, as is shown and generally desired. Such a pinning layer may be used to fix the magnetic moment of the reference layer 130. In some embodiments, the pinning layer may be an AFM layer or multilayer that pins the magnetic moment of the reference layer 130 by an exchange-bias interaction. Note that the reference layer 130 is shown as having a magnetic moment that is in the positive z-direction. In other embodiments, the magnetic moment of the reference layer 130 may be in the negative z-direction or other desired direction. The magnetic junction 100 is also configured to allow the free layer 110 to be switched between stable magnetic states when a write current is passed through the magnetic junction 100. In some embodiments, the write current alone may be used to switch the magnetic junction while in others the write current may be in addition to other switching mechanisms. Thus, the magnetic moment of the free layer 130 is switchable utilizing spin transfer torque. Because the magnetic moment is switchable, the magnetic moment is indicated by a dual headed arrow.

The nonmagnetic spacer layer 120 may be a tunneling barrier layer, conductor, or other structure for which magnetoresistance is exhibited between the reference layer 130 and the free layer 110. In some embodiments, the nonmagnetic spacer layer 120 is a crystalline MgO tunneling barrier layer. Such a nonmagnetic spacer layer may have a preferred crystallographic orientation, such as a (100) orientation. However, as deposited, such a nonmagnetic spacer layer 120 may be amorphous.

Although depicted as simple layers, the reference layer 130 and/or the free layer 110 may include multiple layers. For example, the reference layer 130 and/or the free layer 110 may be a SAF including magnetic layers antiferromagnetically or ferromagnetically coupled through thin layers, such as Ru. In such a SAF, multiple magnetic layers interleaved with thin layer(s) of Ru or other material may be used. The reference layer 130 and/or the free layer 110 may also be another multilayer. The reference layer 130 and/or the free layer 110 are also each shown as having a perpendicular anisotropy energy that exceeds the out-of-plane demagnetization energy. As such, the reference layer 130 and/or the free layer 110 may have a high perpendicular magnetic anisotropy (PMA). Thus, the reference layer 130 and the free layer 110 each has its magnetic moment oriented perpendicular to plane at equilibrium as is shown in FIG. 3. Stated differently, the easy axes of the layers 110 and 130 are perpendicular to plane. However, in other embodiments, one or both of the free layer 110 and the reference layer 130 may have an in-plane magnetic moment.

The magnetic junction 100 also includes the diffusionless transformation layer 140. A diffusionless transformation is a transformation between phases of a material that occurs without long range atomic motion and in which the relative atomic arrangement is preserved. Thus, the atoms which are bonded together may remain bonded together. Their coordination may also be preserved. However, the location of the atoms may be changed slightly. In some cases, the movement of the atoms in the diffusionless transformation layer may be coordinated between many atoms. In other cases, the motion of an individual atom may be small. An example of a diffusionless transformation bulk materials is the martensitic transformation. The diffusionless transformation layer 140 is configured to undergo a diffusionless transformation between two stable phases. In some embodiments, the diffusionless transformation occurs within a particular temperature range that may depend upon the function desired for the diffusionless transformation layer 140.

Diffusionless transformations, such as bulk diffusionless transformations, may be explained as follows. Note, however, that the use of the diffusionless transformation layers described herein, including but not limited to the diffusionless 140, and their functioning in magnetic junctions are not limited to any particular explanation. The phases of a diffusionless transformation material may be termed alpha (the lower temperature phase) and gamma (the higher temperature phase). The material may undergo a diffusionless transformation between the alpha and gamma phases. These phases have intersecting free energy (G) versus temperature (T) curves. For example, the free energy curve for the alpha phase may have a different slope than the free energy curve for the gamma phase. At high temperature the gamma phase offers the lower energy structure. In contrast, the alpha phase is the lower energy structure at low temperature. The intersection point of the alpha and gamma G versus T curves generally does not correspond to the onset of phase transformation. This is because an additional energy difference is generally needed as a driving force to overcome interfacial energy, strain energy and/or other energies for the transformation to occur. As the diffusionless transformation material is cooled from higher temperatures to temperatures farther below the alpha and gamma G versus T intersection, a sufficiently large free energy difference may be achieved. This free energy difference can overcome the additional energetic influences. As a result, the diffusionless phase transition begins. The material may thus undergo a diffusionless transformation from the gamma phase to the alpha phase. Conversely, as the diffusionless transformation material is heated to temperatures farther above the alpha and gamma G versus T intersection, a sufficiently large free energy difference may again be achieved. This free energy difference can overcome the additional energetic influences. As a result, the diffusionless phase transition from the alpha phase to the gamma phase may occur. In some cases, certain orientational relationships are preferred for the phase transitions which correspond to the minimal amount of atomic motion and, presumably, energy savings. However, the origin of diffusionless transformation may vary from material to material. In some cases, dislocations may play a role in nucleating a new phase out of the parent phase. In other cases certain atoms may jump from one interstitial site to another resulting in different coordination. Thus, various mechanisms may play a role in diffusionless transformations.

The diffusionless transformation layer 140 may include materials known to undergo a diffusionless transformation. For example, the diffusionless transformation material may include $Ta_xRu_{1-x}$ and/or $Ni_yTi_{1-y}$, where x is at least 0.2 through 0.8 and y is at least 0.3 and not more than 0.7. In some embodiments, x is approximately 0.46-0.52, and y is 0.46-0.52. However, in other embodiments, other diffusionless transformation materials may be used. For example, transition metal refractory metal combinations may also be used. Such combinations are often used as seed and/or capping layers. Examples of such combinations may include materials such as Ti—W and Ti—Ta. In other embodiments, shape memory alloys, Heusler alloys, and ternary alloys such as Ni—Mn—X, where X may be a metal. Examples of such materials include NiMnAl and NiMnGa. In addition, the diffusionless transformation material(s) used in the diffusionless transformation layer 140 may include dopants. The dopants may be used to configure the amount of movement within the diffusionless transformation layer 140 lattice, the strain placed on surrounding layers due to the transformation, and/or the temperature(s) at which the layer 140 undergoes the diffusionless transformation. The dopants may also be used to engineer the lattice spacing for the phase(s) of the diffusionless transformation layer 140. In addition, the thickness of the diffusionless transformation layer may be tailored to engineer the amount of movement within the lattice, strain and/or the temperature(s) for the diffusionless transformation. In some embodiments, substitutional dopants rather than interstitial dopants may be used. Such dopants may include but are not limited to Fe (e.g. TaRuFe) and Co. The concentrations of the dopants may depend upon the interfaces above and below the layer as well as processing conditions. However, where used, dopants are generally desired to be greater than zero atomic percent and not more than five atomic percent. The thickness of the diffusionless transformation layer 140 may also be selected. In some embodiments, the diffusionless transformation layer 140 is thicker than a unit cell. Thus, the diffusionless transformation layer is desired to be not less than 4-5 Angstroms thick. In some embodiments, the diffusionless transformation layer 140 is at least fifty and not more than one hundred nanometers thick. However, in other embodiments, other thicknesses are possible.

The diffusionless transformation layer 140 of FIG. 3 is a seed layer. Thus, in the embodiment shown, the diffusionless transformation layer 140 adjoins the free layer 110. In other embodiments, in which the positions of the reference layer 130 and the free layer 110 are reversed, the diffusionless transformation layer 140 may adjoin the reference layer 130. Because of the relatively small thicknesses involved in the layers 110, 120, 130 and 140 of the magnetic junction 100, the diffusionless transformation layer 140 may still be close to the nonmagnetic spacer layer 120. Stated differently, the diffusionless transformation layer 140 is adjacent to the nonmagnetic spacer layer 120 and, in some embodiments, may affect the nonmagnetic spacer layer.

In some embodiments, the diffusionless transformation layer 140 is configured to undergo the diffusionless transformation at or near the anneal temperature for the magnetic junction 100. In such embodiments, the diffusionless transformation layer 140 may be considered to be a seeding layer for the nonmagnetic spacer layer 120 and/or the magnetic layers 110 and 130. The transition between the phases of the diffusionless transformation layer 140 may assist in reducing the atomic rearrangement activation energy barrier for adjacent layers 110, 120 and/or 130. Stated differently, the diffusionless transformation that occurs in the layer 140 may assist in allowing the rearrangement of the atoms of the layer 110, 120 and/or 130. The layers 110, 120 and/or 130 may thus more easily change from amorphous to crystalline through the anneal. In addition, the lower temperature phase may be selected to match the desired crystal structure of the adjacent layer 110, 120 and/or 130. Thus, the layers 110, 120 and/or 130 may be more likely to more fully recrystallize into the desired crystal structure having the preferred orientation. For example, if the nonmagnetic spacer layer 120 is MgO, the diffusionless transformation layer 140 may be configured such that after the anneal, the MgO layer 120 is more likely to have transitioned from an amorphous as-deposited layer to an BCC MgO layer having a the preferred crystallographic orientation: (100). As such, the magnetic junction 100 may have a higher TMR and, therefore, an improved signal.

In order to configure the diffusionless transformation layer 140 to undergo the transformation at the desired temperature, preprocessing of the diffusionless transformation layer 140 may be undertaken. Stated differently, the diffusionless transformation layer 140 may be activated by an anneal. For example, the diffusionless transformation layer 140 may be activated by an anneal at temperature(s) exceeding that which the remainder of the films in the stack for the magnetic junction 100 require or would tolerate. In such embodiments, the diffuseness transformation layer 140 may be deposited and annealed prior to deposition of the remaining layers for the magnetic junction 100. Other embodiments may achieve activation in another manner. For example, selection of material(s) for the diffusionless transformation layer 140 may be performed to tune the activation temperature. More specifically, the composition of materials and/or dopants may be selected to tune the annealing temperature to match the anneal temperature for other layers in the magnetic junction 100. Such a process may be used in embodiments in which the diffusionless transformation layer 140 does not lie at the bottom of the stack. Other mechanisms for setting the temperature at which the layer 140 undergoes the diffusionless transformation may be employed in other embodiments.

The use of the diffusionless transformation layer 140 in crystallizing the nonmagnetic spacer layer 120 may also obviate the need for B in the free layer 110 and/or reference layer 130. In particular, the diffusionless transformation layer 140 may provide sufficient flexibility in the lattice that the nonmagnetic spacer layer 120, the free layer 110 and/or the reference layer 130 can crystallize into the desired crystal structure (lattice and orientation). The need for the mobility provided by the use of B may be reduced or eliminated.

Consequently, the interdiffusion of B into other layers, such as an MgO nonmagnetic spacer layer 120, may be reduced or eliminated. Thus, the TMR may be improved. Further, reduction or elimination of the use of B may allow for other materials to be used for the free layer 110 and/or reference layer 130. Such materials may have improved properties such as a higher PMA, higher spin polarization, or improvements in other characteristics. For example, Fe might be used for the free layer 110 and/or reference layer 130. Fe has a higher spin polarization and may have a higher PMA than CoFeB. For example, the hybridization of Fe electrons at an oxide interface may improve the PMA of the layer 110 and/or 130.

The diffusionless transformation layer 140 may also be used to tune the PMA of the free layer 110 and/or the reference layer 130. Because the layer 140 undergoes the diffusionless transformation, the atoms in the diffusionless transformation layer 140 may change physical location. This location change may induce a strain on the free layer 110 and/or the reference layer 130. In some cases, this strain may be well defined. The diffusionless transformation induced strain may affect the PMA of the free layer 110 and/or reference layer 130. Thus, the PMA of the magnetic layers 110 and/or 130 may be tailored. Performance of the magnetic junction 100 may thus be improved.

In addition, the switching of the magnetic junction 100 between stable magnetic states may be improved. The diffusionless transformation layer 140 may be configured to undergo the diffusionless transformation within a temperature range that corresponds to joule heating of the magnetic junction 100 due to a write current being driven through the magnetic junction 100. This transformation may affect the strain and, therefore, the magnetic anisotropy of the free layer 110. In some embodiments, the diffusionless transformation may tilt the magnetic moment of the free layer 110 from the stagnation point. This may increase switching speed and reduce switching current, resulting in improved spin torque switching efficiency. In other embodiments, the diffusionless transformation may simply change the energy barrier to switching. Thus, the critical current required to switch the magnetic state of the magnetic junction 100 may be reduced.

Thus, use of the diffusionless transformation layer 140 may improve the quality of the crystal structure in the layers 110, 120 and 130 of the magnetic junction, may improve the signal (e.g. TMR), may facilitate engineering of the magnetic junction 100, and improve performance of the magnetic junction 100. Note, however, that characteristics such as the surface roughness due to the diffusionless transformation layer 140 as well as the amount of movement in the lattice which may include wafer bowing may be desire to be configured or minimized.

Figure 4:
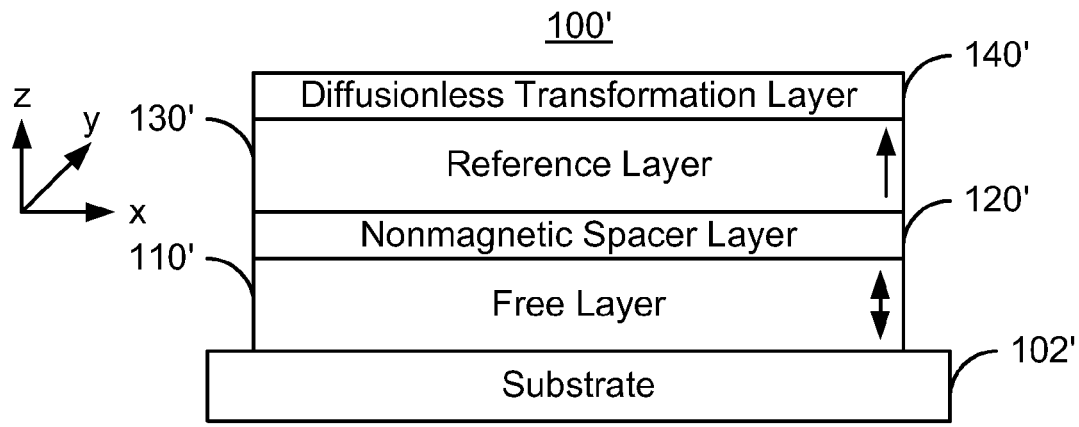
FIG. 4 depicts another exemplary embodiment of a magnetic junction including a diffusionless transformation layer and switchable using spin transfer.

FIG. 4 depicts another exemplary embodiment of a magnetic junction 100' including a diffusionless transformation layer 140' and that is switchable using spin transfer. For clarity, FIG. 4 is not to scale. The magnetic junction 100' is analogous to the magnetic junction 100. Thus, analogous layers are labeled similarly. The magnetic junction 100' includes a free layer 110', a nonmagnetic spacer layer 120', a reference layer 130' and a diffusionless transformation layer 140' analogous to the layers 110, 120, 130, and 140, respectively. Although layers 110', 120', 130' and 140' are shown with a particular orientation, this orientation may vary in other embodiments. In some embodiments, an optional seed layer (not shown), an optional pinning layer (not shown) and/or optional capping layer (not shown) may be included. The magnetic junction 100' is also configured to allow the magnetization of the free layer 110' to be switched between stable magnetic states when a write current is passed through the magnetic junction 100'. Thus, the magnetization of the free layer 130' is switchable utilizing spin transfer torque.

In the magnetic junction 100', the diffusionless transformation layer 140' is a capping layer. Thus, in the embodiment shown, the diffusionless transformation layer 140' adjoins the reference layer 130'. In other embodiments, in which the positions of the reference layer 130' and the free layer 110' are reversed, the diffusionless transformation layer 140' may adjoin the free layer 110'. The diffusionless transformation layer 140' may have the same structure and/or function as the diffusionless transformation layer 140. For example, the diffusionless transformation layer 140' may be configured to undergo the diffusionless transformation at or near the anneal temperature for the magnetic junction 100' and/or have a lattice structure selected to match the desired crystal structure of the adjacent layer(s) 110', 120' and/or 130'. Thus, the layers 110', 120' and/or 130' may be more likely to more fully recrystallize into the desired crystal structure having the preferred orientation. As such, the magnetic junction 100' may have a higher TMR and, therefore, an improved signal. In addition, the transformation layer 140' may also obviate the need for B in the free layer 110' and/or reference layer 130'. Consequently, the contamination of other layers, such as an MgO nonmagnetic spacer layer 120', may be reduced or eliminated. Thus, the TMR may be improved. Further, other materials to be used for the free layer 110' and/or reference layer 130'. Such materials may have improved properties such as a higher PMA, higher spin polarization, or improvements in other characteristics. The diffusionless transformation layer 140' may also be used to tune the PMA of the free layer 110' and/or the reference layer 130'. Performance of the magnetic junction 100' may thus be improved. The diffusionless transformation layer 140' may be configured to undergo the diffusionless transformation within a temperature range that corresponds to joule heating of the magnetic junction 100' due to a write current being driven through the magnetic junction 100'. This transformation may increase switching speed and/or reduce switching current. Thus, use of the diffusionless transformation layer 140' may improve the magnetic junction 100'.

The magnetic junction 100' may thus share the benefits of the magnetic junction 100. For example, the magnetic junction 100' may have improved signal, improved control over magnetic and barrier layers, less contamination of layers, reduced switching current and improved PMA.

Figure 5:
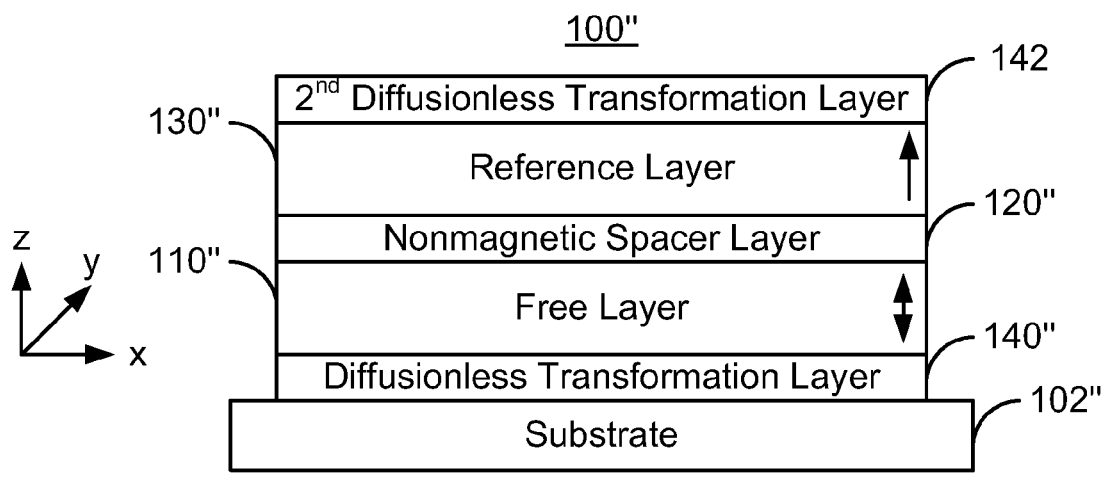
FIG. 5 depicts another exemplary embodiment of a magnetic junction including a diffusionless transformation layer and switchable using spin transfer.

FIG. 5 depicts another exemplary embodiment of a magnetic junction 100" including two diffusionless transformation layers 140" and 142. The magnetic junction 100" is also switchable using spin transfer. For clarity, FIG. 5 is not to scale. The magnetic junction 100" is analogous to the magnetic junctions 100 and 100'. Thus, analogous layers are labeled similarly. The magnetic junction 100" includes a free layer 110", a nonmagnetic spacer layer 120", a reference layer 130" and diffusionless transformation layers 140" and 142 analogous to the layers 110, 120, 130, 140 and 140', respectively. Although layers 110", 120", 130", 140" and 142 are shown with a particular orientation, this orientation may vary in other embodiments. In some embodiments, an optional seed layer (not shown), an optional pinning layer (not shown) and/or optional capping layer (not shown) may be included. The magnetic junction 100" is also configured to allow the magnetization of the free layer 110" to be switched between stable magnetic states when a write current is passed through the magnetic junction 100".

In the magnetic junction 100", the diffusionless transformation layer 140" is a seeding layer, while the diffusionless transformation layer 142 is a capping layer. The diffusionless transformation layers 140" and 142 may have the same structure and/or function as the diffusionless transformation layers 140 and 140'. For example, the diffusionless transformation layer 140" and/or 142 may be configured to undergo the diffusionless transformation at or near the anneal temperature for the magnetic junction 100" and/or have a lattice structure selected to match the desired crystal structure of the adjacent layer(s) 110", 120" and/or 130". Thus, the layers 110", 120" and/or 130" may be more likely to more fully recrystallize into the desired crystal structure having the preferred orientation. As such, the magnetic junction 100" may have a higher TMR and, therefore, an improved signal. In addition, the transformation layer 140" and/or 142 may also obviate the need for B in the free layer 110" and/or reference layer 130". Consequently, the contamination of other layers, such as an MgO nonmagnetic spacer layer 120", may be reduced or eliminated. Thus, the TMR may be improved. Further, other materials to be used for the free layer 110" and/or reference layer 130". Such materials may have improved properties such as a higher PMA, higher spin polarization, or improvements in other characteristics. The diffusionless transformation layer 140" and/or 142 may also be used to tune the PMA of the free layer 110" and/or the reference layer 130". Performance of the magnetic junction 100" may thus be improved. The diffusionless transformation layer 140" and/or 142 may be configured to undergo the diffusionless transformation within a temperature range that corresponds to joule heating of the magnetic junction 100" due to a write current being driven through the magnetic junction 100". This transformation may increase switching speed and/or reduce switching current. Thus, use of the diffusionless transformation layer 140" and/or 142 may improve the magnetic junction 100".

The magnetic junction 100" may thus share the benefits of the magnetic junctions 100 and/or 100'. For example, the magnetic junction 100" may have improved signal, improved control over magnetic and barrier layers, less contamination of layers, reduced switching current and improved PMA.

Figure 6:
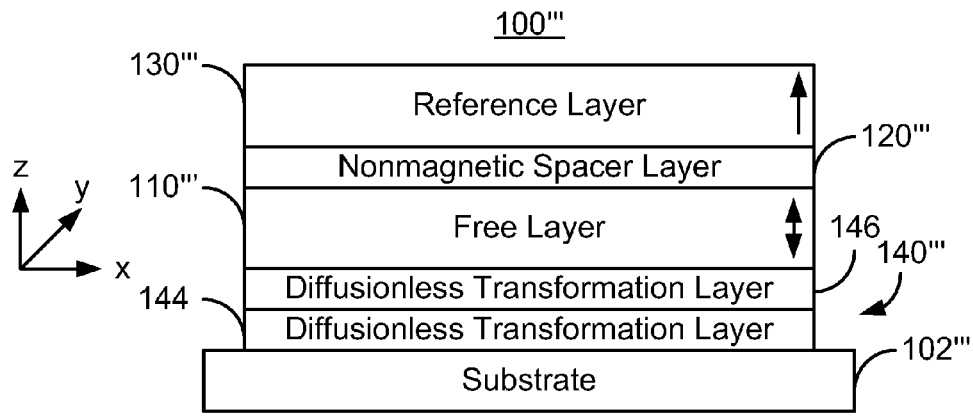
FIG. 6 depicts another exemplary embodiment of a magnetic junction including a diffusionless transformation layer and switchable using spin transfer.

FIG. 6 depicts another exemplary embodiment of a magnetic junction 100''' including a diffusionless transformation layer 140''' and that is switchable using spin transfer. For clarity, FIG. 6 is not to scale. The magnetic junction 100''' is analogous to the magnetic junctions 100, 100' and/or 100". Thus, analogous layers are labeled similarly. The magnetic junction 100''' includes a free layer 110''', a nonmagnetic spacer layer 120''', a reference layer 130''' and a diffusionless transformation layer 140''' analogous to the layers 110/110'/110", 120/120'/120", 130/120'/120", and 140/140'/140"/142, respectively. Although layers 110''', 120''', 130''' and 140''' are shown with a particular orientation, this orientation may vary in other embodiments. In addition, although the diffusionless transformation layer 140''' is depicted as a seed layer, in other embodiments, the layer 140''' could be a capping layer or could be used both as a seed and capping layer. In some embodiments, an optional seed layer (not shown), an optional pinning layer (not shown) and/or optional capping layer (not shown) may be included. The magnetic junction 100''' is also configured to allow the magnetization of the free layer 110' to be switched between stable magnetic states when a write current is passed through the magnetic junction 100'''.

In the magnetic junction 100', the diffusionless transformation layer 140" is a seed layer. Thus, in the embodiment shown, the diffusionless transformation layer 140''' adjoins the free layer 110'''. In other embodiments, in which the positions of the reference layer 130''' and the free layer 110''' are reversed, the diffusionless transformation layer 140''' may adjoin the reference layer 130'''.

The diffusionless transformation layer 140''' is a bilayer including two diffusionless transformation layers 144 and 146. The diffusionless transformation layers 144 and 146 may have the same structure and/or function as the diffusionless transformation layers 140, 140' and/or 140". For example, the diffusionless transformation layer 144 and/or 146 may be configured to undergo the diffusionless transformation at or near the anneal temperature for the magnetic junction 100' and/or have a lattice structure selected to match the desired crystal structure of the adjacent layer(s) 110''', 120''' and/or 130'''. In addition, the transformation layer 144 and/or 146 may obviate the need for B in the free layer 110''' and/or reference layer 130'''. The diffusionless transformation layer 144 and/or 146 may also be used to tune the PMA of the free layer 110''' and/or the reference layer 130'''. The diffusionless transformation layer 144 and/or 146 may be configured to undergo the diffusionless transformation within a temperature range that corresponds to joule heating of the magnetic junction 100''' due to a write current being driven through the magnetic junction 100'''. Thus, bilayer diffusionless transformation layer 140''' may have multiple functions and undergo diffusionless transformations at different temperatures because the characteristics of each diffusionless transformation layer 144 and 146 may be individually tailored. Further, the diffusionless transformation layer 140''' might include more diffusionless transformation layers to extend its functions and the number and/or temperature range at which diffusionless transformations occur.

The diffusionless transformation layer 140''' may result in the magnetic junction 100' may have a higher TMR and, therefore, an improved signal. The contamination of other layers, such as an MgO nonmagnetic spacer layer 120''', may be reduced or eliminated. Thus, the TMR may be improved. Further, other materials to be used for the free layer 110''' and/or reference layer 130'''. Such materials may have improved properties such as a higher PMA, higher spin polarization, or improvements in other characteristics. The diffusionless transformation layer 140''' may also be used to tune the PMA of the free layer 110''' and/or the reference layer 130'''. Performance of the magnetic junction 100''' may thus be improved. The diffusionless transformation layer 140''' may be configured to undergo the diffusionless transformation within a temperature range that corresponds to joule heating of the magnetic junction 100''' due to a write current being driven through the magnetic junction 100'''. This transformation may increase switching speed and/or reduce switching current. Thus, use of the diffusionless transformation layer 140''' may improve the magnetic junction 100'.

Figure 7:
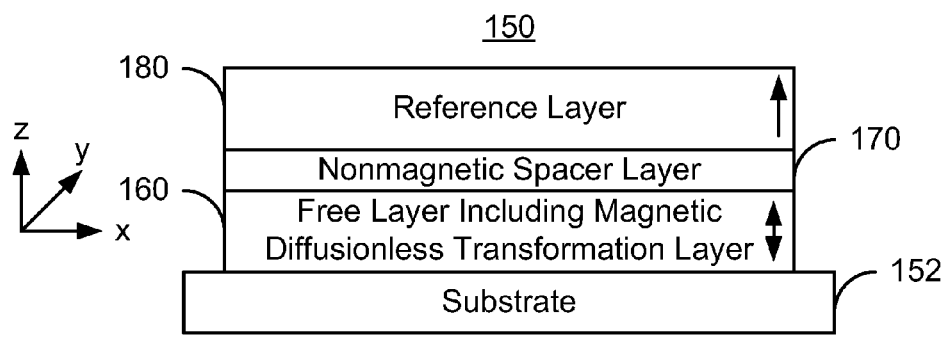
FIG. 7 depicts another exemplary embodiment of a magnetic junction including a diffusionless transformation layer and switchable using spin transfer.

FIG. 7 depicts another exemplary embodiment of a magnetic junction 150 including a diffusionless transformation layer and that is switchable using spin transfer. For clarity, FIG. 7 is not to scale. The magnetic junction 150 is analogous to the magnetic junctions 100, 100', 100", and/or 100'''. Thus, analogous layers are labeled similarly. The magnetic junction 150 includes a free layer 160, a nonmagnetic spacer layer 170, and a reference layer 180 analogous to the layers 110/110'/110"/110''', 120/120'/120"/120''' and 130/130'/130"/130''', respectively. Although layers 160, 170 and 180 are shown with a particular orientation, this orientation may vary in other embodiments. In some embodiments, an optional seed layer (not shown), an optional pinning layer (not shown) and/or optional capping layer (not shown) may be included. The magnetic junction 150 is also configured to allow the magnetization of the free layer 160 to be switched between stable magnetic states when a write current is passed through the magnetic junction 150.

In the magnetic junction 150, the diffusionless transformation layer is incorporated into the free layer 160. In some embodiments, the diffusionless transformation layer is a magnetic diffusionless transformation layer. For example, the magnetic diffusionless transformation layer may include a Heusler alloy such as NiMnX, where X is one or more of Sn, In, Sb and Ga. In some embodiments, the free layer 160 may consist of the magnetic diffusionless transformation layer. In other embodiments, a nonmagnetic or magnetic diffusionless transformation layer (not separately shown) may be incorporated into a multilayer free layer 160, for example in a SAF.

In addition to its routine functions as a free layer, the free layer 160 including the diffusionless transformation layer may have the same structure and/or function as the diffusionless transformation layer(s) 140, 140', 140", 140''', 142, 142', 144 and/or 146. For example, the free layer 160 including the diffusionless transformation layer may be configured to undergo the diffusionless transformation at or near the anneal temperature for the magnetic junction 150 and/or have a lattice structure selected to match the desired crystal structure of the adjacent layer(s) 170 and/or 180. Thus, the layers 170 and/or 180 may be more likely to more fully recrystallize into the desired crystal structure having the preferred orientation. As such, the magnetic junction 150 may have a higher TMR and, therefore, an improved signal. In addition, the free layer 160 including the diffusionless transformation layer may also obviate the need for B in the free layer and/or reference layer 180. Consequently, the contamination of other layers, such as an MgO nonmagnetic spacer layer 170, may be reduced or eliminated. Thus, the TMR may be improved. Further, other materials to be used for the free layer 160 including the diffusionless transformation layer and/or reference layer 180. Such materials may have improved properties such as a higher PMA, higher spin polarization, or improvements in other characteristics. The diffusionless transformation of the free layer 160 may also be used to tune the PMA of the free layer 160 and/or the reference layer 180. Performance of the magnetic junction 150 may thus be improved. The diffusionless transformation layer in the free layer 160 may be configured to undergo the diffusionless transformation within a temperature range that corresponds to joule heating of the magnetic junction 150 due to a write current being driven through the magnetic junction 150. This transformation may increase switching speed and/or reduce switching current. Thus, use of the free layer 160 including the diffusionless transformation layer may improve the magnetic junction 150.

The magnetic junction 150 may thus share the benefits of the magnetic junctions 100, 100', 100", and/or 100'''. For example, the magnetic junction 150 may have improved signal, improved control over magnetic and barrier layers, less contamination of layers, reduced switching current and improved PMA.

Figure 8:
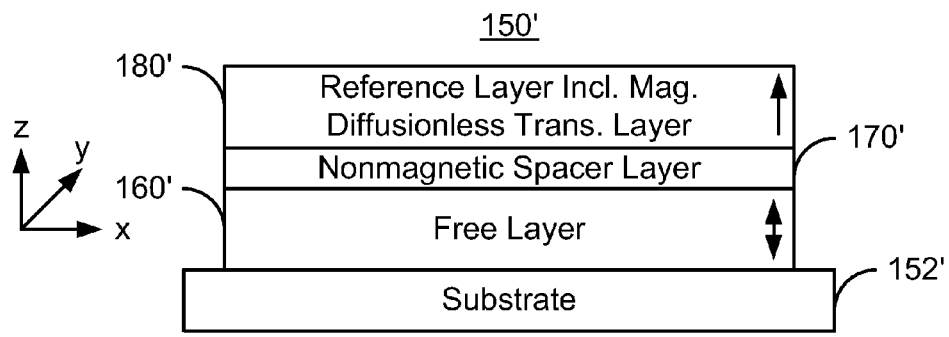
FIG. 8 depicts another exemplary embodiment of a magnetic junction including a diffusionless transformation layer and switchable using spin transfer.

FIG. 8 depicts another exemplary embodiment of a magnetic junction 150' including a diffusionless transformation layer and that is switchable using spin transfer. For clarity, FIG. 8 is not to scale. The magnetic junction 150' is analogous to the magnetic junctions 100, 100', 100", 100''' and/or 150. Thus, analogous layers are labeled similarly. The magnetic junction 150' includes a free layer 160' including a diffusionless transformation layer, a nonmagnetic spacer layer 170', and a reference layer 180' analogous to the layers 150, 160 and 180, respectively. Although layers 160', 170' and 180' are shown with a particular orientation, this orientation may vary in other embodiments. In some embodiments, an optional seed layer (not shown), an optional pinning layer (not shown) and/or optional capping layer (not shown) may be included. The magnetic junction 150' is also configured to allow the magnetization of the free layer 160' to be switched between stable magnetic states when a write current is passed through the magnetic junction 150'.

In the magnetic junction 150', the diffusionless transformation layer is incorporated into the reference layer 180'. In some embodiments, the diffusionless transformation layer is a magnetic diffusionless transformation layer. For example, the magnetic diffusionless transformation layer may include a Heusler alloy such as NiMnX, where X is one or more of Sn, In, Sb and Ga. In some embodiments, the reference layer 180' may consist of the magnetic diffusionless transformation layer. In other embodiments, a nonmagnetic or magnetic diffusionless transformation layer (not separately shown) may be incorporated into a multilayer reference layer 180', for example in a SAF.

In addition to its routine functions as a reference layer, the diffusionless transformation layer of the reference layer 180' may have the same structure and/or function as the diffusionless transformation layer(s) 140, 140', 140", 140''', 142, 142', 144 and/or 146. For example, the reference layer 180' including the diffusionless transformation layer may be configured to undergo the diffusionless transformation at or near the anneal temperature for the magnetic junction 150' and/or have a lattice structure selected to match the desired crystal structure of the adjacent layer(s) 160' and/or 170'. Thus, the layers 160' and/or 170' may be more likely to more fully recrystallize into the desired crystal structure having the preferred orientation. As such, the magnetic junction 150' may have a higher TMR and, therefore, an improved signal. In addition, the reference layer 180' including the diffusionless transformation layer may also obviate the need for B in the free layer 160 and/or reference layer. Consequently, the contamination of other layers, such as an MgO nonmagnetic spacer layer 170', may be reduced or eliminated. Thus, the TMR may be improved. Further, other materials to be used for the reference layer 180' including the diffusionless transformation layer and/or free layer 160'. Such materials may have improved properties such as a higher PMA, higher spin polarization, or improvements in other characteristics. The diffusionless transformation of the reference layer 180' may also be used to tune the PMA of the reference layer 180' and/or the free layer 160'. Performance of the magnetic junction 150' may thus be improved. The diffusionless transformation layer in the reference layer 180' may be configured to undergo the diffusionless transformation within a temperature range that corresponds to joule heating of the magnetic junction 150' due to a write current being driven through the magnetic junction 150'. This transformation may increase switching speed and/or reduce switching current. Thus, use of the reference layer 180' including the diffusionless transformation layer may improve the magnetic junction 150.

The magnetic junction 150' may thus share the benefits of the magnetic junctions 100, 100', 100", 100''' and/or 150. For example, the magnetic junction 150' may have improved signal, improved control over magnetic and barrier layers, less contamination of layers, reduced switching current and improved PMA.

Figure 9:
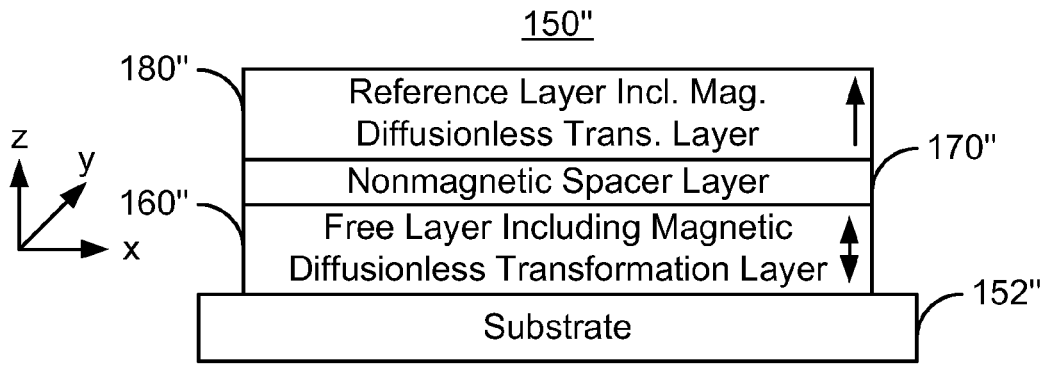
FIG. 9 depicts another exemplary embodiment of a magnetic junction including a diffusionless transformation layer and switchable using spin transfer.

FIG. 9 depicts another exemplary embodiment of a magnetic junction 150" including a diffusionless transformation layer and that is switchable using spin transfer. For clarity, FIG. 9 is not to scale. The magnetic junction 150" is analogous to the magnetic junctions 100, 100', 100", 100''', 150 and/or 150'. Thus, analogous layers are labeled similarly. The magnetic junction 150" includes a free layer 160" including a diffusionless transformation layer, a nonmagnetic spacer layer 170", and a reference layer 180" including another diffusionless transformation layer that are analogous to the layers 150/150', 160/160' and 180/180', respectively. Although layers 160", 170" and 180" are shown with a particular orientation, this orientation may vary in other embodiments. In some embodiments, an optional seed layer (not shown), an optional pinning layer (not shown) and/or optional capping layer (not shown) may be included. The magnetic junction 150" is also configured to allow the magnetization of the free layer 160' to be switched between stable magnetic states when a write current is passed through the magnetic junction 150".

In the magnetic junction 150", diffusionless transformation layers are incorporated into the free layer 150" and the reference layer 180". In some embodiments, the diffusionless transformation layer(s) are a magnetic diffusionless transformation layer(s). For example, the magnetic diffusionless transformation layer may include a Heusler alloy such as NiMnX, where X is one or more of Sn, In, Sb and Ga. In some embodiments, the free layer 160" and the reference layer 180" may consist of the magnetic diffusionless transformation layer. In other embodiments, a nonmagnetic or magnetic diffusionless transformation layer (not separately shown) may be incorporated into a multilayer reference layer 180" and/or free layer 160", for example in a SAF.

In addition to their routine functions as a free layer and a reference layer, the diffusionless transformation layers of the free layer 160" and the reference layer 180" may have the same structure and/or function as the diffusionless transformation layer(s) 140, 140', 140", 140''', 142, 142', 144 and/or 146. The magnetic junction 150" may thus share the benefits of the magnetic junctions 100, 100', 100", 100''', 150 and/or 150'. For example, the magnetic junction 150" may have improved signal, improved control over magnetic and barrier layers, less contamination of layers, reduced switching current and improved PMA.

Figure 10:
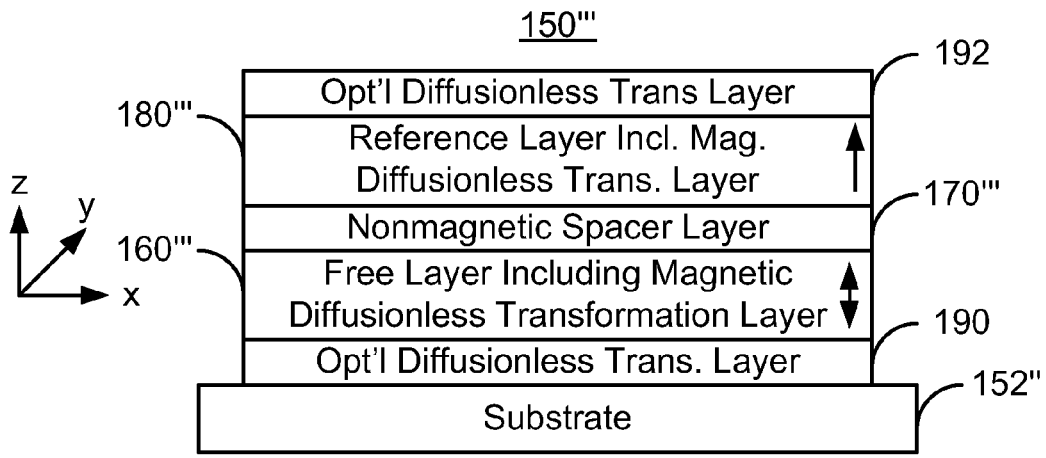
FIG. 10 depicts another exemplary embodiment of a magnetic junction including a diffusionless transformation layer and switchable using spin transfer.

FIG. 10 depicts another exemplary embodiment of a magnetic junction 150''' including a diffusionless transformation layer and that is switchable using spin transfer. For clarity, FIG. 10 is not to scale. The magnetic junction 150''' is analogous to the magnetic junctions 100, 100', 100", 100''', 150, 150' and/or 150". Thus, analogous layers are labeled similarly. The magnetic junction 150''' includes a free layer 160''' that may include a diffusionless transformation layer, a nonmagnetic spacer layer 170''', and a reference layer 180''' that may include another diffusionless transformation layer that are analogous to the layers 150/150'/150", 160/160'/160" and 180/180'/180", respectively. Although layers 160''', 170''' and 180''' are shown with a particular orientation, this orientation may vary in other embodiments. In some embodiments, an optional seed layer (not shown), an optional pinning layer (not shown) and/or optional capping layer (not shown) may be included. The magnetic junction 150''' is also configured to allow the magnetization of the free layer 160''' to be switched between stable magnetic states when a write current is passed through the magnetic junction 150'''.

In addition, the magnetic junction 150''' is shown as including two optional diffusionless transformation layers 190 and 192 that act as seed and capping layers, respectively. The optional diffusionless transformation layers 190 and/or 192 may include $Ta_xRu_{1-x}$ and/or $Ni_yTi_{1-y}$ where x is at least 0.2 through 0.8 and y is at least 0.3 and not more than 0.7. In some embodiments, x is approximately 0.46-0.52, and y is 0.46-0.52. Thus, the layers 190 and 192 are analogous to the layers 140, 140', 140", 140''', 142, 144, and/or 146. In the magnetic junction 150''', diffusionless transformation layers are incorporated into the free layer 160''' and/or the reference layer 180'''. In some embodiments, such diffusionless transformation layer(s) are a magnetic diffusionless transformation layer(s). For example, these magnetic diffusionless transformation layer may include a Heusler alloy such as NiMnX, where X is one or more of Sn, In, Sb and Ga. In some embodiments, the free layer 160''' and/or the reference layer 180''' may consist of the magnetic diffusionless transformation layer. In other embodiments, a nonmagnetic or magnetic diffusionless transformation layer (not separately shown) may be incorporated into a multilayer reference layer 180''' and/or free layer 160''', for example in a SAF.

In addition to their routine functions as a free layer and a reference layer, the diffusionless transformation layers of the free layer 160''' and/or the reference layer 180''' may have analogous structure and/or function as the diffusionless transformation layer(s) 140, 140', 140", 140''', 142, 142', 144 and/or 146. In addition, further tailoring may be provided using the diffusionless transformation layers 190 and/or 192. The magnetic junction 150''' may thus share the benefits of the magnetic junctions 100, 100', 100", 100''', 150, 150' and/or 150". For example, the magnetic junction 150''' may have improved signal, improved control over magnetic and barrier layers, less contamination of layers, reduced switching current and improved PMA.

Figure 11:
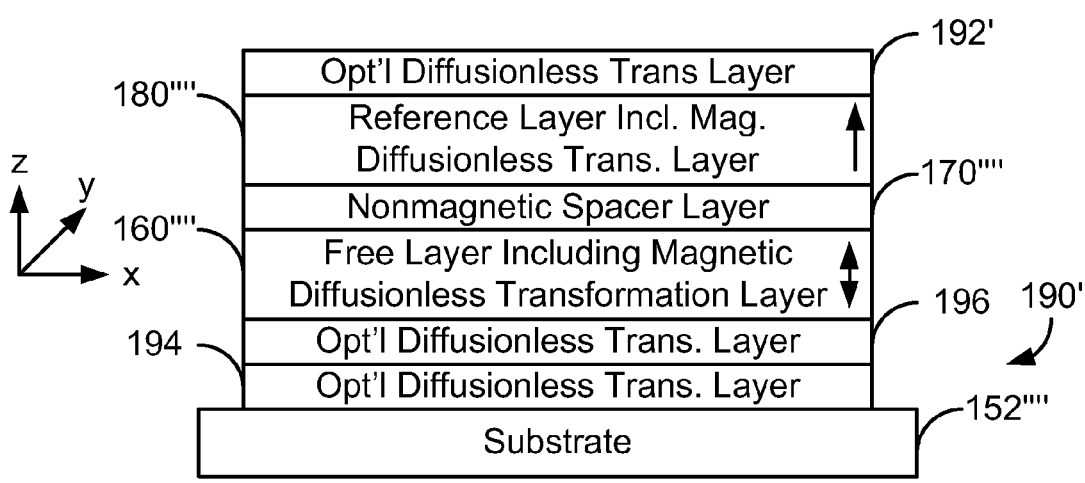
FIG. 11 depicts another exemplary embodiment of a magnetic junction including a diffusionless transformation layer and switchable using spin transfer.

FIG. 11 depicts another exemplary embodiment of a magnetic junction 150'''' including a diffusionless transformation layer and that is switchable using spin transfer. For clarity, FIG. 11 is not to scale. The magnetic junction 150'''' is analogous to the magnetic junctions 100, 100', 100", 100''', 150, 150', 150" and/or 150'''. Thus, analogous layers are labeled similarly. The magnetic junction 150'''' includes a free layer 160'''' that may include a diffusionless transformation layer, a nonmagnetic spacer layer 170'''', and a reference layer 180'''' that may include another diffusionless transformation layer that are analogous to the layers 150/150'/150"/150''', 160/160'/160"/160''' and 180/180'/180"/180''', respectively. Although layers 160'''', 170'''' and 180'''' are shown with a particular orientation, this orientation may vary in other embodiments. In some embodiments, an optional seed layer (not shown), an optional pinning layer (not shown) and/or optional capping layer (not shown) may be included. The magnetic junction 150'''' is also configured to allow the magnetic moment of the free layer 160'''' to be switched between stable magnetic states when a write current is passed through the magnetic junction 150''''.

Like the magnetic junction 150''', the magnetic junction 150'''' is shown as including two optional diffusionless transformation layers 190' and 192' that act as seed and capping layers, respectively. However, the diffusionless transformation layer 190' is shown as a bilayer including two diffusionless transformation layers 194 and 196. In other embodiments, either or both of the layers 190' and 192' may include multiple diffusionless transformation layers. The optional diffusionless transformation layers 190', 194, 196 and/or 192' may include $Ta_xRu_{1-x}$ and/or $Ni_yTi_{1-y}$ where x is at least 0.2 through 0.8 and y is at least 0.3 and not more than 0.7. In some embodiments, x is approximately 0.46-0.52, and y is 0.46-0.52. Thus, the layers 190', 192', 194 and/or 196 are analogous to the layers 140, 140', 140", 140''', 142, 144, and/or 146. In the magnetic junction 150'''', diffusionless transformation layers are also incorporated into the free layer 160'''' and/or the reference layer 180''''. In some embodiments, such diffusionless transformation layer(s) are a magnetic diffusionless transformation layer(s). For example, these magnetic diffusionless transformation layer may include a Heusler alloy such as NiMnX, where X is one or more of Sn, In, Sb and Ga. In some embodiments, the free layer 160'''' and/or the reference layer 180'''' may consist of the magnetic diffusionless transformation layer. In other embodiments, a nonmagnetic or magnetic diffusionless transformation layer (not separately shown) may be incorporated into a multilayer reference layer 180"" and/or free layer 160"", for example in a SAF.

In addition to their routine functions as a free layer and a reference layer, the diffusionless transformation layers of the free layer 160"" and/or the reference layer 180"" may have analogous structure and/or function as the diffusionless transformation layer(s) 140, 140', 140", 140'", 142, 142', 144 and/or 146. In addition, further tailoring may be provided using the diffusionless transformation layers 190' and/or 192'. The magnetic junction 150"" may thus share the benefits of the magnetic junctions 100, 100', 100", 100'", 150, 150', 150" and/or 150'". For example, the magnetic junction 150"" may have improved signal, improved control over magnetic and barrier layers, less contamination of layers, reduced switching current and improved PMA.

Figure 12:
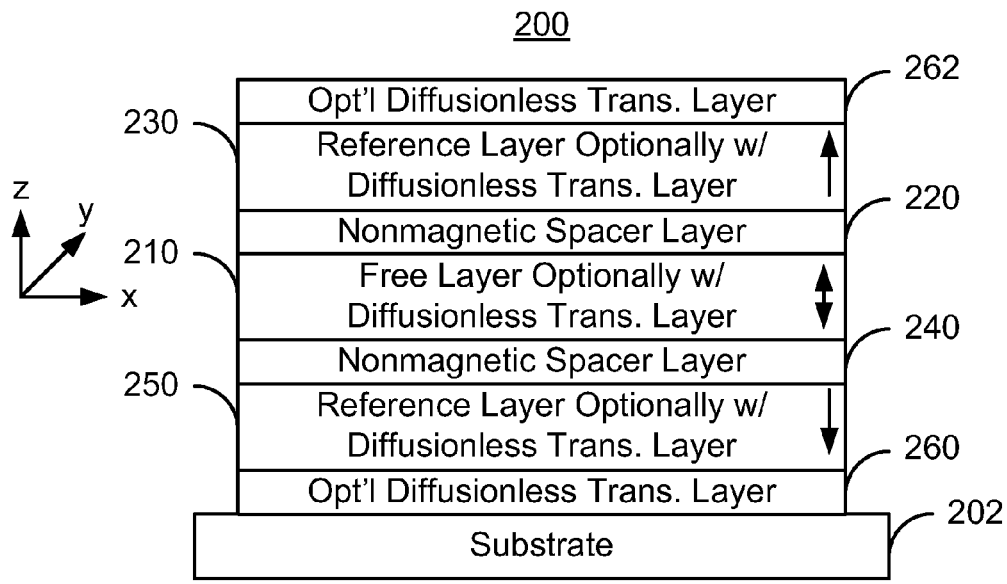
FIG. 12 depicts another exemplary embodiment of a magnetic junction including a diffusionless transformation layer and switchable using spin transfer.

FIG. 12 depicts another exemplary embodiment of a magnetic junction 200 including a diffusionless transformation layer and that is switchable using spin transfer. For clarity, FIG. 12 is not to scale. The magnetic junction 200 is analogous to the magnetic junctions 100, 100', 100", 100'", 150, 150', 150", 150'" and/or 150"". Thus, analogous layers are labeled similarly. The magnetic junction 200 includes a free layer 210, a nonmagnetic spacer layer 220, and a reference layer 230 analogous to the layers 110/110'/110"/1110'"/160/160'/160"/160'"/170"", 120/120'/120"/120'"/170/170'/170"/170'"/170"" and 130/130'/130"/130'"/180/180'/180"/180'"/180"", respectively. The magnetic junction 200 also includes an additional nonmagnetic spacer layer 240 and an additional reference layer 250 that are analogous to the layers 120/120'/120"/120'"/170/170'/170"/170'"/170"" and 130/130'/130"/130'"/180/180'/180"/180'"/180"", respectively. Thus, the magnetic junction 200 is a dual magnetic junction. In some embodiments, an optional seed layer (not shown), an optional pinning layer (not shown) and/or optional capping layer (not shown) may be included. The magnetic junction 200 is also configured to allow the magnetization of the free layer 160 to be switched between stable magnetic states when a write current is passed through the magnetic junction 150.

The dual magnetic junction 200 includes diffusionless transformation layers 260 and/or 262. The diffusionless transformation layers 260 and 262 are analogous to the layers 140, 140', 140", 140'", 142, 144, 146 190', 192', 194 and/or 196. The optional diffusionless transformation layers 260 and/or 262 may include $Ta_xRu_{1-x}$ and/or $Ni_yTi_{1-y}$ where x is at least 0.2 through 0.8 and y is at least 0.3 and not more than 0.7. In some embodiments, x is approximately 0.46-0.52, and y is 0.46-0.52. In addition, the free layer 210 and reference layers 230 and 250 may have diffusionless transformation layers incorporated therein. In some embodiments, such diffusionless transformation layer is a magnetic diffusionless transformation layer. For example, the magnetic diffusionless transformation layer may include a Heusler alloy such as NiMnX, where X is one or more of Sn, In, Sb and Ga. In some embodiments, the free layer 210 and/or reference layers 230 and 250 may consist of the magnetic diffusionless transformation layer. In other embodiments, a nonmagnetic or magnetic diffusionless transformation layer (not separately shown) may be incorporated into a multilayer free layer 210 and/or reference layers 230 and 250, for example in a SAF.

The magnetic junction 200 may share the benefits of the magnetic junctions 100, 100', 100", 100'", 150, 150', 150", 150'" and/or 150"". For example, the magnetic junction 200 may have improved signal, improved control over magnetic and barrier layers, less contamination of layers, reduced switching current and improved PMA.

In addition, the diffusionless transformation layers in one or more of the layers 210, 230, 250, 260 and/or 262 may be used in setting the magnetic moments of the reference layers 230 and 250 to the desired state. The dual magnetic junction 200 is depicted with the magnetic moments of the reference layers 230 and 250 in the dual state (i.e. aligned antiparallel). This is the state that is generally preferred for writing using spin transfer torque. However, for reading, the it may be desirable for the magnetic junction 200 to be in the antidual state (magnetic moments aligned parallel). Such a state may have a larger TMR and, therefore, signal. One or more of the diffusionless transitions for the layer(s) 210, 230, 250, 260 and/or 262 may be set such that the magnetic anisotropy of one or both of the reference layers 230 and 250 is reduced. The magnetic moment of the reference layer 230 or 250 may thus be switched. Thus, the reference layers 230 and 250 may be placed in the dual state or the antidual state as desired. For example, in some embodiments, the same joule heating during a write operation that may reduce the critical switching current may cause one or more of the layers 210, 230, 250, 260 and/or 262 to undergo a diffusionless transformation. This transformation may be used to place the reference layers 230 and 250 in the dual state. When the write current is removed, the diffusionless transformation places the relevant layers 210, 230, 250, 260 and/or 262 back in the original phase. The reference layers 230 and 250 may then be switched back to the antidual state for reading or storage. Thus, operation of the dual magnetic junction 200 may be further improved.

In the embodiments of magnetic junctions 100, 100', 100", 100'", 150, 150', 150", 150'", 150"" and/or 200 depicted above, various diffusionless transformation layers having various functions have been shown. One of ordinary skill in the art will, however, recognize that various aspects of the magnetic junctions 100, 100', 100", 100'", 150, 150', 150", 150'", 150"" and/or 200 may be combined. Thus, multiple diffusionless transformation layers having multiple functions may be combined.

Figure 13:
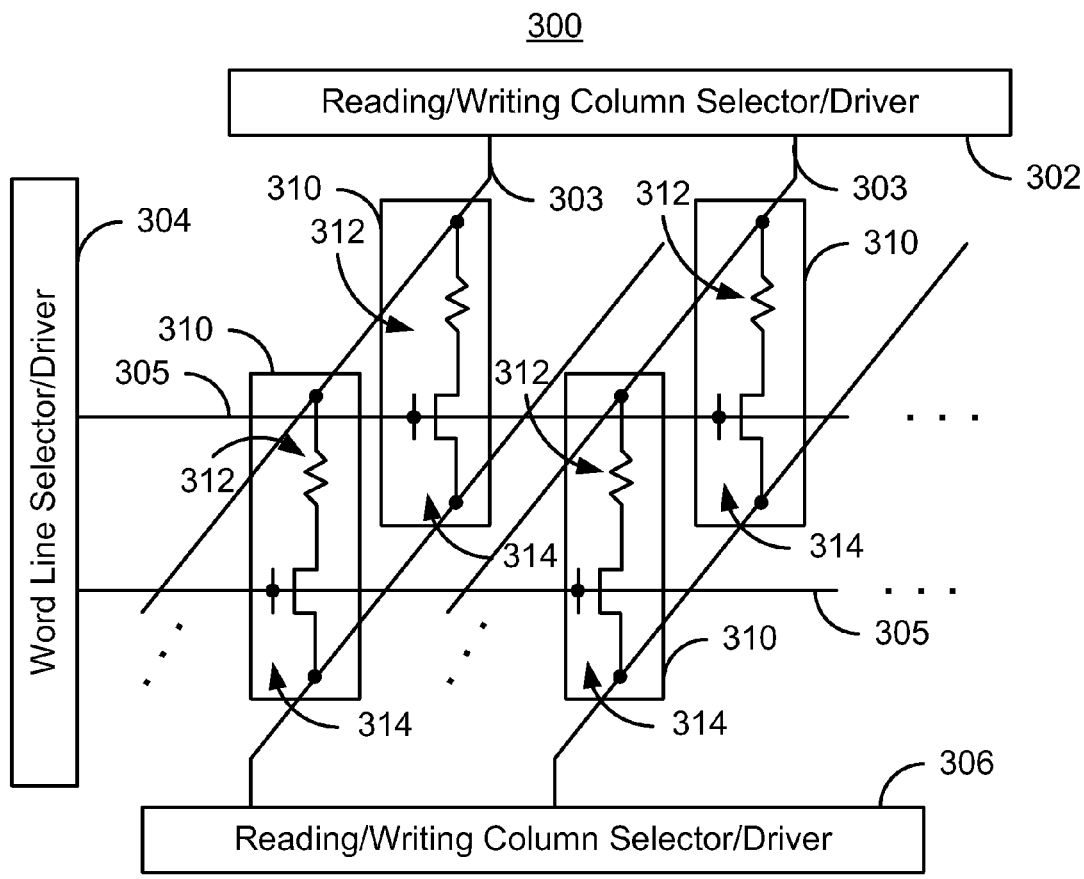
FIG. 13 depicts an exemplary embodiment of a memory utilizing magnetic junctions in the memory element(s) of the storage cell(s).

Further, the magnetic junctions 100, 100', 100", 100'", 150, 150', 150", 150'", 150"" and/or 200 may be used in a magnetic memory. FIG. 13 depicts an exemplary embodiment of one such memory 300. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may include one or more of the magnetic junctions 100, 100', 100", 100'", 150, 150', 150", 150'", 150"" and/or 200. Although one magnetic junction 312 is shown per cell 310, in other embodiments, another number of magnetic junctions 312 may be provided per cell.

Because the magnetic memory 300 utilizes the magnetic junctions magnetic junctions 100, 100', 100", 100'", 150, 150', 150", 150'", 150"" and/or 200 performance may be improved. For example, improved TMR, a lower critical current, better tailored PMA, switchable reference layers and improved fabrication of the magnetic memory 300 may be achieved.

Figure 14:
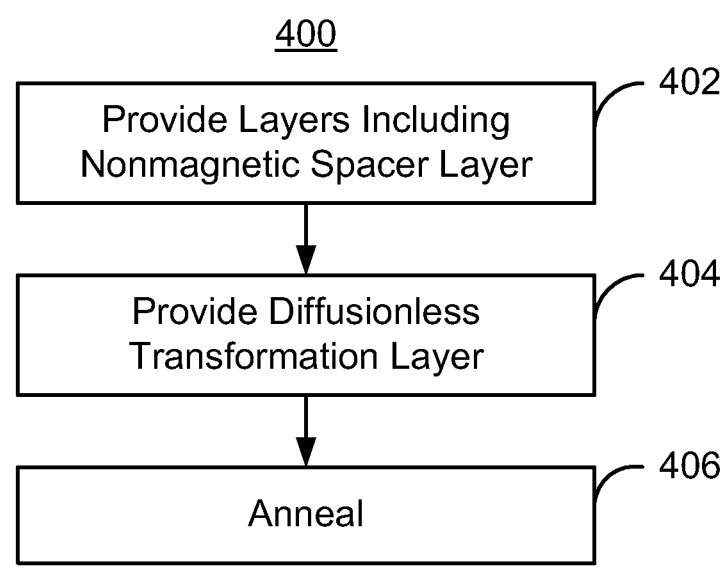
FIG. 14 depicts an exemplary embodiment of a method for fabricating a magnetic junction including a diffusionless transformation layer and switchable using spin transfer.

FIG. 14 depicts an exemplary embodiment of a method 400 for fabricating magnetic junctions having diffusionless transformation layers, such as the magnetic junctions 100, 100', 100", 100'", 150, 150', 150", 150'", 150"" and/or 200. For simplicity, some steps may be omitted, combined, and/or interleaved. The method 400 is described in the context of the 100, 100', 100", 100'", 150, 150', 150", 150'", 150"" and/or 200. However, the method 400 may be used on other magnetic junctions. Further, the method 400 may be incorporated into fabrication of magnetic memories. Thus the method 400 may be used in manufacturing a STT-MRAM 300 or other magnetic memory. The method 400 may also include providing optional seed layer(s), optional capping layer(s) and optional pinning layer (not shown).

The layers of the 100, 100', 100", 100'", 150, 150', 150", 150'", 150"" and/or 200 are provided, via step 402. Step 402 includes providing at least a nonmagnetic spacer layer, such as an MgO tunneling barrier layer. Depending upon the location and function of the diffusionless transformation layer, other layers such as a free layer, an additional nonmagnetic spacer layer and/or reference layer(s) may be provided.

The diffusionless transformation layer(s) for the 100, 100', 100", 100'", 150, 150', 150", 150'", 150"" and/or 200 are provided, via step 404. Step 404 may include depositing the desired materials at the desired thickness for the diffusionless transformation layer(s). As part of this step, the appropriate dopants may be selected and provided for the diffusionless transformation layer(s). In some embodiments, step 404 includes providing a bilayer. In some embodiments, the diffusionless transformation layer(s) may be magnetic and may function as all or part of the free layer and/or pinned layer. Because the diffusionless transformation layer(s) provided in step 404 may be within the stack for the magnetic junction, steps 402 and 404 may be interleaved. Further, the magnetic junction may be defined in a single step that removes a portion of all of the layers in the magnetic junction which were full film deposited.

The magnetic junctions 100, 100', 100", 100'", 150, 150', 150", 150'", 150"" and/or 200 are annealed, via step 406. Step 406 may include multiple anneals. In some embodiments, step 406 is carried out at anneal temperature(s) within the range of two hundred to three hundred and fifty degrees Celsius. Because of the presence of the diffusionless transformation layer(s) the crystallization achieved by the anneal in step 406 may be more fully completed. Thus, using the method 400, the benefits of the magnetic junctions 100, 100', 100", 100'", 150, 150', 150", 150'", 150"" and/or 200 may be achieved.

A method and system for providing a magnetic junction having a diffusionless transformation layer and that is switchable using spin transfer and a memory fabricated using the magnetic junction have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a nonmagnetic spacer layer; and
   at least one diffusionless transformation layer, the at least one diffusionless transformation layer being configured to undergo at least one diffusionless transformation, the at least one diffusionless transformation being configured to occur in a temperature range in which the nonmagnetic spacer layer crystallizes, the temperature range being greater than an operating temperature range of the magnetic junction;
   wherein the magnetic junction is configured to be switchable between a plurality of stable magnetic states when a write current is passed through the magnetic junction.

2. The magnetic junction of claim 1 wherein the magnetic junction resides on a substrate and wherein the at least one diffusionless transformation layer is at least one of a diffusionless transformation seed layer, a diffusionless transformation capping layer, and a diffusionless transformation magnetic layer, the diffusionless transformation seed layer being between the nonmagnetic spacer layer and the substrate, the nonmagnetic spacer layer being between the diffusionless transformation layer capping and the substrate, the at least one diffusionless transformation magnetic layer excluding a Heusler alloy and excluding a ternary alloy including Ni and Mn.

3. The magnetic junction of claim 2 wherein the at least one diffusionless transformation layer is adjacent to the nonmagnetic spacer layer.

4. The magnetic junction of claim 3 wherein the at least one diffusionless transformation layer adjoins the nonmagnetic spacer layer.

5. The magnetic junction of claim 2 wherein the magnetic junction includes a free layer and a reference layer, the nonmagnetic spacer layer residing between the free layer and the reference layer, at least one of the free layer and the reference layer including the diffusionless transformation magnetic layer.

6. The magnetic junction of claim 5 wherein the diffusionless transformation magnetic layer corresponds to the free layer.

7. The magnetic junction of claim 5 wherein the free layer consists of the diffusionless transformation magnetic layer.

8. The magnetic junction of claim 5 wherein the reference layer consists of the diffusionless transformation magnetic layer.

9. The magnetic junction of claim 2 wherein the nonmagnetic spacer layer includes MgO and wherein the magnetic junction includes a free layer and a reference layer, at least one of the reference layer and the free layer consisting of Fe.

10. The magnetic junction of claim 2 wherein the at least one diffusionless transformation layer is a bilayer including a first diffusionless transformation layer and a second diffusionless transformation layer, the first diffusionless transformation layer configured to undergo a first diffusionless transformation in a first temperature range, the second diffusionless transformation layer configured to undergo a second diffusionless transformation in a second temperature range.

11. The magnetic junction of claim 1 wherein the at least one diffusionless transformation layer is at least one of a nonmagnetic diffusionless transformation seed layer and a nonmagnetic diffusionless transformation capping layer, the at least one diffusionless transformation layer including at least one of $Ta_yRu_{1-y}$, TiW and Ti—Ta, where y is at least 0.3.

12. The magnetic junction of claim 1 wherein the at least one diffusionless transformation layer has a high temperature phase and a low temperature phase, the low temperature phase having a crystal structure selected based on at least one of a nonmagnetic spacer layer crystal structure, a free layer crystal structure and a reference layer crystal structure.

13. The magnetic junction of claim 1 wherein the at least one diffusionless transformation layer includes at least one of a transition metal-refractory metal combination, $Ta_yRu_{1-y}$, TiW, Ti—Ta and a shape memory alloy, the shape memory alloy excluding a Heusler alloy and excluding a ternary alloy including Ni and Mn, where x is at least 0.2 and y is at least 0.3.

14. The magnetic junction of claim 13 wherein the at least one diffusionless transformation layer includes greater than zero atomic percent and not more than five atomic percent of at least one dopant.

15. The magnetic junction of claim 1 wherein the magnetic junction is a dual magnetic junction.

16. A magnetic memory comprising:
a plurality of magnetic storage cells, each of the plurality of magnetic storage cells including at least one magnetic junction, the at least one magnetic junction including a plurality of layers, the plurality of layers including a nonmagnetic spacer layer and at least one diffusionless transformation layer, the at least one diffusionless transformation layer being configured to undergo at least one diffusionless transformation, the at least one diffusionless transformation being configured to occur in a temperature range in which the nonmagnetic spacer layer crystallizes, the temperature range being greater than an operating temperature range of the magnetic junction, the magnetic junction being configured to be switchable between a plurality of stable magnetic states when a write current is passed through the magnetic junction; and
a plurality of bit lines.

17. The magnetic memory of claim 16 wherein the magnetic junction resides on a substrate and wherein the at least one diffusionless transformation layer is at least one of a diffusionless transformation seed layer, a diffusionless transformation capping layer, and a diffusionless transformation magnetic layer, the diffusionless transformation seed layer being between the nonmagnetic spacer layer and the substrate, the nonmagnetic spacer layer being between the diffusionless transformation layer capping and the substrate, the at least one diffusionless transformation magnetic layer excluding a Heusler alloy and excluding a ternary alloy including Ni and Mn.

18. The magnetic memory of claim 16 wherein the at least one diffusionless transformation layer is adjacent to the nonmagnetic spacer layer.

19. The magnetic memory of claim 16 wherein the at least one diffusionless transformation layer adjoins the nonmagnetic spacer layer.

20. The magnetic memory of claim 16 wherein the magnetic junction includes a free layer and a reference layer, the nonmagnetic spacer layer residing between the free layer and the reference layer, at least one of the free layer and the reference layer including the diffusionless transformation magnetic layer.

21. The magnetic memory of claim 20 wherein the diffusionless transformation magnetic layer corresponds to the free layer.

22. The magnetic memory of claim 20 wherein the free layer consists of the diffusionless transformation magnetic layer.

23. The magnetic memory of claim 20 wherein the reference layer consists of the diffusionless transformation magnetic layer.

24. The magnetic memory of claim 16 wherein the nonmagnetic spacer layer includes MgO and wherein the magnetic junction includes a free layer and a reference layer, at least one of the reference layer and the free layer consisting of Fe.

25. The magnetic memory of claim 16 wherein the at least one diffusionless transformation layer is a bilayer including a first diffusionless transformation layer and a second diffusionless transformation layer, the first diffusionless transformation layer configured to undergo a first diffusionless transformation in a first temperature range, the second diffusionless transformation layer configured to undergo a second diffusionless transformation in a second temperature range.

26. The magnetic memory of claim 25 wherein the at least one diffusionless transformation layer has a high temperature phase and a low temperature phase, the low temperature phase having a crystal structure selected based on at least one of a nonmagnetic spacer layer crystal structure, a free layer crystal structure and a reference layer crystal structure.

27. The magnetic memory of claim 16 wherein the at least one diffusionless transformation layer at least one of a nonmagnetic diffusionless transformation seed layer and a nonmagnetic diffusionless transformation capping layer, the at least one diffusionless transformation layer including at least one of $Ta_yRu_{1-y}$, TiW and Ti—Ta, where y is at least 0.3.

28. The magnetic memory of claim 16 wherein the at least one diffusionless transformation layer includes at least one of a transition metal-refractory metal combination, $Ni_xTi_{1-x}$, $Ta_yRu_{1-y}$, TiW, Ti—Ta, a shape memory alloy, a Heusler alloy, and a ternary alloy including Ni and Mn, where x is at least 0.2 and y is at least 0.3.

29. The magnetic memory of claim 28 wherein the at least one diffusionless transformation layer includes greater than zero atomic percent and not more than five atomic percent of at least one dopant.

30. The magnetic memory of claim 16 wherein the magnetic junction is a dual magnetic junction.

31. A method for providing a magnetic junction for use in a magnetic device comprising:
providing a plurality of magnetic layers including a nonmagnetic spacer layer; and
providing at least one diffusionless transformation layer, the at least one diffusionless transformation layer being configured to undergo at least one diffusionless transformation, the at least one diffusionless transformation being configured to occur in a temperature range in which the nonmagnetic spacer layer crystallizes, the temperature range being greater than an operating temperature range of the magnetic junction;
wherein the magnetic junction is configured to be switchable between a plurality of stable magnetic states when a write current is passed through the magnetic junction.

32. A method for providing a magnetic junction for use in a magnetic device comprising:
providing a plurality of layers including a nonmagnetic spacer layer; and
providing at least one diffusionless transformation layer, the at least one diffusionless transformation layer being configured to undergo at least one diffusionless transformation, the at least one diffusionless transformation being configured to occur in a temperature range in which the nonmagnetic spacer layer crystallizes, the temperature range being greater than an operating temperature range of the magnetic junction;
wherein the magnetic junction is configured to be switchable between a plurality of stable magnetic states when a write current is passed through the magnetic junction.

33. The method of claim 32 wherein the at least one diffusionless transformation layer is configured to undergo at least one diffusionless transformation in at least one temperature range corresponding to a crystalline transformation of the nonmagnetic spacer layer, the method further comprising:
annealing the magnetic junction in the at least one temperature range.

* * * * *